(12) United States Patent
Landru et al.

(10) Patent No.: US 11,219,851 B2
(45) Date of Patent: Jan. 11, 2022

(54) VERTICAL FURNACE WITH DEVICE FOR TRAPPING CONTAMINANTS

(71) Applicant: Soitec, Bernin (FR)

(72) Inventors: Didier Landru, Le Champ-près-Froges (FR); Oleg Kononchuk, Theys (FR)

(73) Assignee: Soitec, Bernin (FR)

( * ) Notice: Subject to any disclaimer, the term of this patent is extended or adjusted under 35 U.S.C. 154(b) by 227 days.

(21) Appl. No.: 16/341,390

(22) PCT Filed: Sep. 21, 2017

(86) PCT No.: PCT/FR2017/052528
§ 371 (c)(1),
(2) Date: Apr. 11, 2019

(87) PCT Pub. No.: WO2018/069595
PCT Pub. Date: Apr. 19, 2018

(65) Prior Publication Data
US 2020/0054978 A1    Feb. 20, 2020

(51) Int. Cl.
*B01D 50/00*    (2006.01)
*B01D 46/00*    (2006.01)
(Continued)

(52) U.S. Cl.
CPC ..... *B01D 46/0024* (2013.01); *B01D 46/0045* (2013.01); *B01D 39/06* (2013.01); *H01L 21/67109* (2013.01)

(58) Field of Classification Search
CPC ............ B01D 46/0024; B01D 46/0045; B01D 39/06; H01L 21/67109
See application file for complete search history.

(56) References Cited

U.S. PATENT DOCUMENTS 4,050,913 A * 9/1977 Roach .................. B01D 50/002
96/381
4,420,314 A * 12/1983 Barron, Jr. ................ B04C 5/06
55/436

(Continued)

FOREIGN PATENT DOCUMENTS

JP    1996-227862 A    9/1996
JP    1996-288232 A    11/1996
(Continued)

OTHER PUBLICATIONS

International Written Opinion for International Application No. PCT/FR2017/052528 dated Jan. 19, 2018, 5 pages.
(Continued)

*Primary Examiner* — Dung H Bui
(74) *Attorney, Agent, or Firm* — TraskBritt (57) ABSTRACT

A vertical furnace includes a chamber intended for receiving a loading column, an inlet channel for fresh gas, arranged at an upper end of the chamber, the loading column comprising an upper portion, and a central portion for supporting a plurality of substrates. The vertical furnace further comprises a trapping device made of at least one material suitable for trapping all or part of the contaminants present in the fresh gas. The trapping device includes a circular part arranged on the upper part of the loading column, the circular part comprising fins regularly distributed over an upper surface of the circular part in order to increase the contact surface of the trapping device with the fresh gas.

11 Claims, 6 Drawing Sheets

(51) Int. Cl.
  *H01L 21/67*    (2006.01)
  *B01D 39/06*    (2006.01)

(56) References Cited

U.S. PATENT DOCUMENTS

| | | | |
|---|---|---|---|
| 5,480,464 A * | 1/1996 | De Villiers | B01D 45/16 |
| | | | 55/320 |
| 6,302,963 B1 | 10/2001 | Mitzan | |
| 7,279,020 B2 * | 10/2007 | Christiansen | B04C 3/06 |
| | | | 55/338 |
| 9,192,886 B2 * | 11/2015 | Nieuwoudt | B04C 3/06 |
| 2005/0053535 A1 | 3/2005 | Beauchaine et al. | |
| 2010/0229795 A1 * | 9/2010 | Tanabe | C30B 25/16 |
| | | | 118/725 |
| 2017/0218513 A1 * | 8/2017 | Nakada | C23C 16/4401 |

FOREIGN PATENT DOCUMENTS

| | | |
|---|---|---|
| JP | 1997-022878 A | 1/1997 |
| JP | 2007-059606 A | 3/2007 |
| JP | 2001-237239 | 1/2008 |
| JP | 2008-186852 A | 8/2008 |
| WO | WO-2015150772 A1 * | 10/2015 ............ B01D 45/12 |

OTHER PUBLICATIONS

International Search Report for International Application No. PCT/FR2017/052528 dated Jan. 19, 2018, 2 pages.
Japanese Official Notice of Rejection for Japanese Application No. 2019-540706 dated Sep. 7, 2021, 5 pages.

\* cited by examiner

VERTICAL FURNACE WITH DEVICE FOR TRAPPING CONTAMINANTS

CROSS-REFERENCE TO RELATED APPLICATIONS

This application is a national phase entry under 35 U.S.C. § 371 of International Patent Application PCT/FR2017/052528, filed Sep. 21, 2017, designating the United States of America and published as International Patent Publication WO 2018/069595 A1 on Apr. 19, 2018, which claims the benefit under Article 8 of the Patent Cooperation Treaty to French Patent Application Serial No. 1659813, filed Oct. 11, 2016.

TECHNICAL FIELD

The present disclosure relates to a vertical furnace. It relates in particular to a vertical furnace provided with a device for trapping all or some of the contaminants present in the fresh gases injected during the heat treatments.

BACKGROUND

Silicon or silicon-on-insulator (SOI) substrates are widely used for the fabrication of microelectronic devices. As is well known per se, such a substrate comprises an active layer of silicon and a buried oxide, which are positioned on a carrier substrate. To enable an even greater integration of transistors on these substrates, the reduction in the lateral dimensions of the individual components and the fineness of etching require substrates of increasing quality, both in terms of crystalline quality and uniformity of layers.

For the production of an SOI substrate, high-temperature heat treatments are applied, in particular to consolidate the bonding interface or to achieve the finishing of the active layer of silicon and of the buried oxide. In particular, a step of thermal annealing at around 1200° C., under an inert atmosphere may be used for the thermal smoothing of the active layer in order to achieve the required degree of surface roughness, typically <0.2 nm RMS.

In the physics of thermal smoothing, the gases present at the surface of the substrates play a very important role. At high temperatures, the oxygen reacts instantaneously with the silicon, preventing the smoothing and causing surface over-etching. A very low oxygen content (<10 ppm) must therefore be maintained during the smoothing step in order to obtain the required degree of surface roughness. The other gases such as $N_2$, $H_2O$, $CO$, $CO_2$ have similar effects; these are referred to as contaminant gases.

Figure 1:
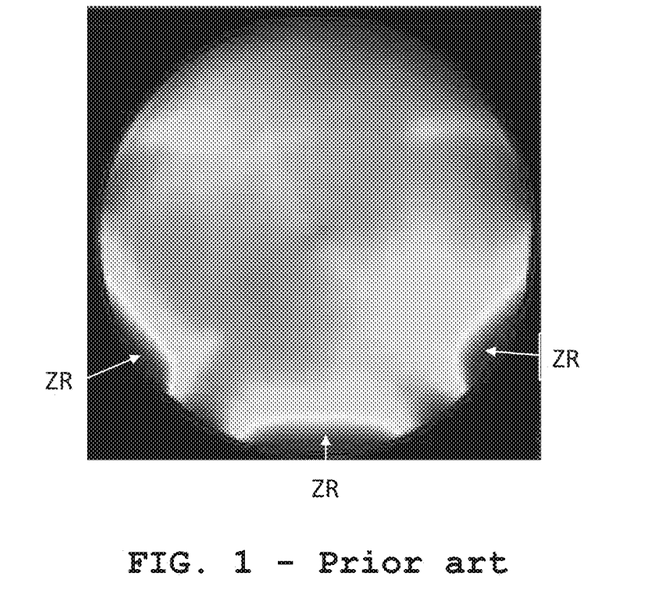
FIG. 1 shows mapping results from a haze measurement and illustrates the peripheral roughness zones (ZR) that occur in known devices.

However, the incoming flow of inert gas, based on argon, still contains a small amount of contaminant gases. The latter react in contact with the substrates, more particularly at the edges thereof; the substrates located in the furnace in the vicinity of the fresh gas inlet are customarily the most affected, and have zones of high roughness at the edges. These peripheral roughness zones (ZR) are clearly visible in the mappings (FIG. 1) resulting from a haze measurement. The haze, measured in ppm, is derived from a method using the optical reflectivity properties of the surface to be characterized, and corresponds to an optical signal scattered by the surface, due to the microroughness thereof.

These peripheral zones of high roughness lead to thickness irregularities of the final active layer of the SOI substrate that are incompatible with the targeted applications.

There is no simple solution for purifying the incoming flow of fresh gas to sufficient levels, the smoothing of the surface of the SOI substrates being extremely sensitive to even the minimal presence of contaminant gases. The solutions from the prior art (for example US 2005/0053535), commercial filters or hot purifiers capable of decreasing the concentrations of contaminants to below ppt, do not enable the complete suppression of zones of high roughness at the periphery of substrates located in the upper portion of the chamber.

BRIEF SUMMARY

The present disclosure aims to overcome all or some of the drawbacks of the prior art. In some embodiments, the present disclosure includes a vertical furnace that makes it possible to limit the presence of contaminants in the fresh gas coming into contact with the plurality of substrates to be treated.

The vertical furnace may comprise:
- a chamber intended to receive a charging column,
- a fresh gas inlet channel, positioned at an upper end of the chamber,
- the charging column comprising an upper portion, and a central portion for supporting a plurality of substrates.

The vertical furnace may further comprise a trapping device formed from at least one material capable of trapping all or some of the contaminants present in the fresh gas. The trapping device includes a circular part positioned on the upper portion of the charging column, the circular part comprising blades, regularly distributed over an upper surface of the circular part, in order to increase the contact area of the trapping device with the fresh gas. The circular part also comprises a central opening, the diameter of which may be from 20% to 50% of the diameter of the circular part.

The trapping device may further comprise a plurality of screens, held in the upper portion of the charging column, above the locations of the central portion, which are intended to support the substrates.

According to advantageous features of the disclosure, taken alone or in combination:
- the blades may be substantially vertical;
- the blades may be removable;
- at least the screen placed in the upper position may comprise a central orifice;
- all or some of the screens positioned between the screen placed in the upper position and a screen placed in the lower position, may each comprise a central orifice, the diameter of which is smaller than the diameter of the orifice of the neighboring screen placed above;
- the screen placed in the upper position may comprise vertical elements placed around the central orifice;
- the trapping device may be removable when the charging column is in a position for discharging the substrates, outside of the chamber;
- the trapping device may be composed of silicon.

BRIEF DESCRIPTION OF THE DRAWINGS

Other features and advantages of the disclosure will become apparent from the following detailed description, with reference to the accompanying figures, in which.

DETAILED DESCRIPTION

In the descriptive section, the same references as in the figures may be used for elements of the same nature.

Figure 2:
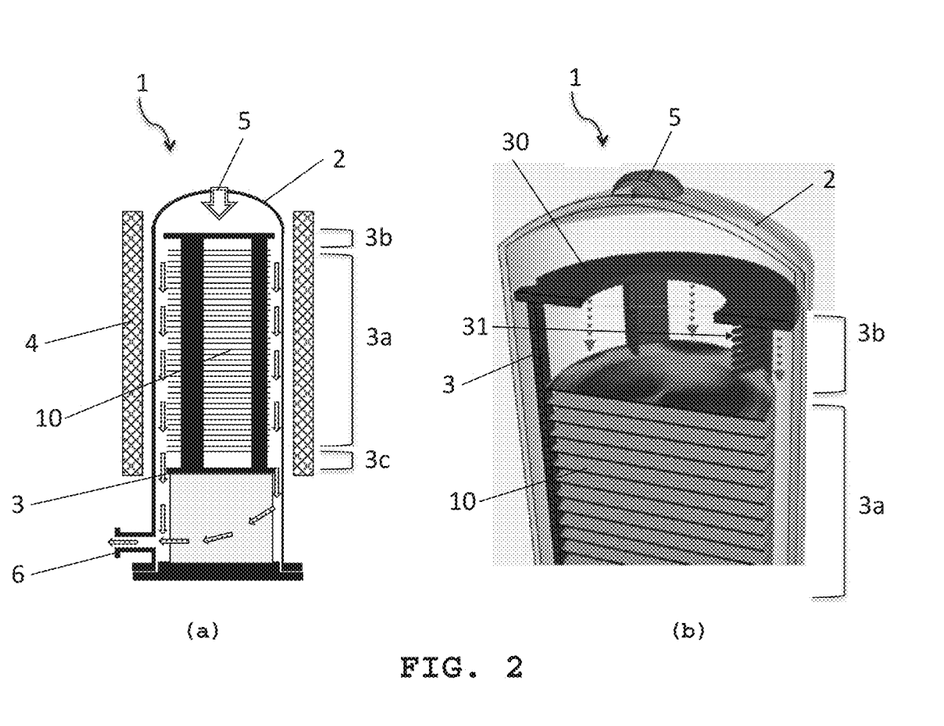
FIG. 2, Panels (a) and (b), illustrate a vertical furnace from the prior art.

The disclosure relates to heat treatment equipment and in particular to a furnace having a vertical structure. As is well known in the prior art, a vertical furnace 1 comprises a chamber 2 intended to receive a charging column 3 (FIG. 2). It also comprises the charging column 3, a central portion 3a of which is configured to support a plurality of substrates 10. The central portion 3a is located, in the chamber 2, in a central zone where the regulation of the heating elements 4 of the vertical furnace 1 ensures a good temperature homogeneity. The charging column 3 also comprises an upper portion 3b and a lower portion 3c, in which portions there is no substrate. The upper portion 3b comprises an upper flat element 30. The upper portion 3b may also comprise locations 31, under the upper flat element 30, which are substantially identical to the locations in which the substrate 10 are supported in the central portion 3a of the charging column 3.

The vertical furnace 1 comprises a fresh gas inlet channel 5, positioned at an upper end of the chamber 2, and a gas outlet channel 6, positioned at lower end of the chamber 2.

Figure 3A:
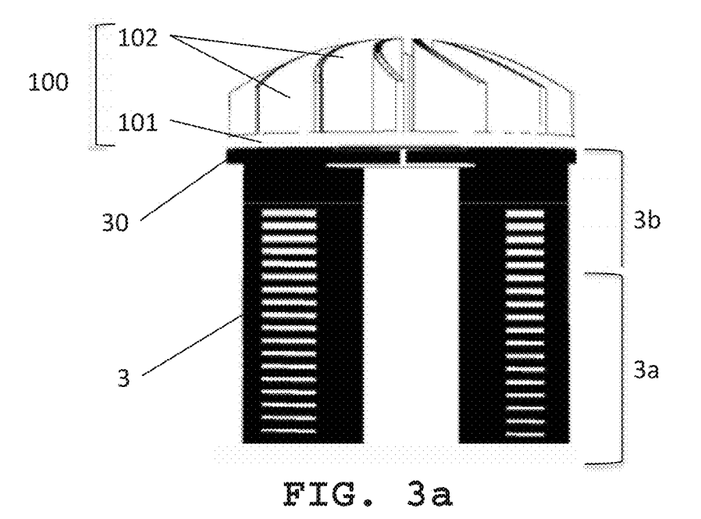
FIGS. 3a through 3d illustrate a first embodiment of a trapping device for a vertical furnace in accordance with the present disclosure.
Figure 4A:
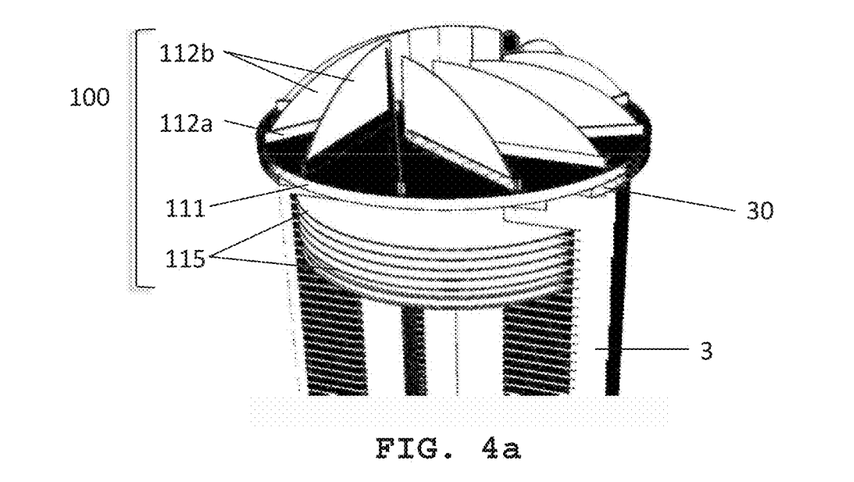
FIGS. 4a through 4d illustrate a second embodiment of a trapping device for a vertical furnace in accordance with the present disclosure.
Figure 5A:
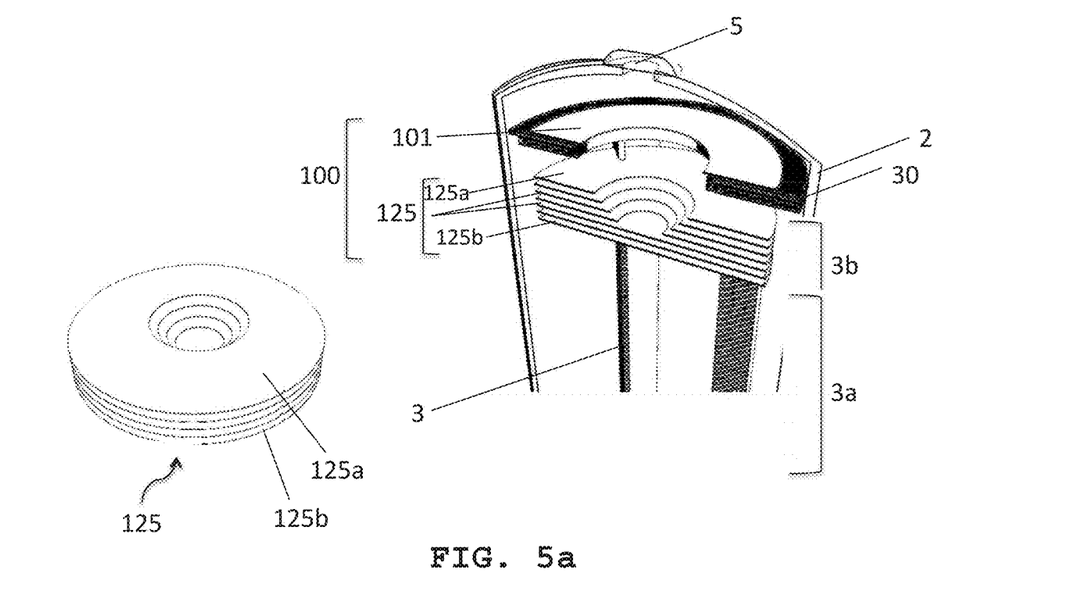
FIGS. 5a and 5b illustrate a third embodiment of a trapping device for a vertical furnace in accordance with the present disclosure.

As illustrated in FIGS. 3a, 4a and 5a, the vertical furnace 1 according to the disclosure also comprises a trapping device 100 positioned on the upper portion 3b of the charging column 3. The trapping device 100 is thus placed as close as possible to the inlet of fresh gas and does not encroach on the central portion 3a of the charging column 3, in which the substrates 10 to be treated are found. The trapping device 100 is formed from at least one material capable of trapping all or some of the contaminants present in the fresh gas.

Advantageously, the trapping device 100 is composed of silicon, silicon being highly reactive, at high temperatures, with the contaminant gases contained in the fresh gas. The material of the trapping device 100 could consist of monocrystalline, polycrystalline or amorphous silicon or silicon carbide, as non-limiting examples.

The trapping device 100 includes a circular part 101, 111 positioned on the upper portion 3b of the charging column 3, the circular part 101, 111 comprising blades 102, 112b, regularly distributed over an upper surface of the circular part 101, 111, in order to increase the contact area of the trapping device 100 with the fresh gas.

Advantageously, the trapping device 100 is removable when the charging column 3 is in a position for discharging the substrate 10, outside of the chamber 2. This enables the potential changing and cleaning of the trapping device 100 when it is loaded with contaminants. The changing of the trapping device 100 could be defined as a function of the number of treatments carried out in the vertical furnace 1.

According to a first embodiment of the disclosure, the trapping device 100 comprises a circular part 101 positioned on the upper portion 3b of the charging column 3 (FIG. 3a). In particular, the circular part 101 is positioned on the upper flat element 30.

Figure 3B:
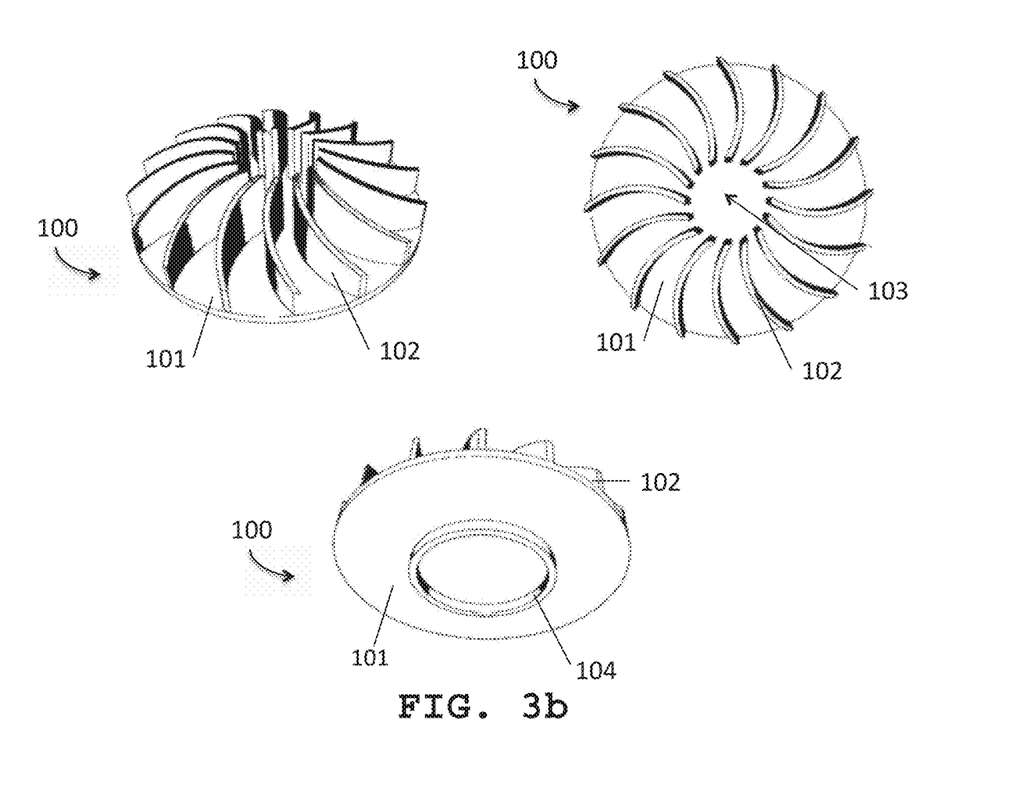

Advantageously, as illustrated in FIG. 3b, the blades 102 on the circular part 101 are substantially vertical, regularly distributed over the upper surface of the circular part 101. As mentioned above, the blades 102 have the objective of increasing the contact area of the trapping device 100 with the fresh gas, and thus of promoting the trapping of the contaminant gases contained in the fresh gas. The shape of the blades 102 and also the arrangement thereof could also be selected to promote a uniform flow of the fresh gas toward the walls of the chamber 2. In the example illustrated in FIG. 3b, a central region 103 of the circular part 101 is devoid of blades 102: this is the zone into which the inlet channel 5 injects the fresh gas. The shape of the blades 102 promotes uniform flow of fresh gas toward the periphery of the circular part 101, and therefore toward the walls of the chamber 2.

Advantageously, the circular part 101 also comprises a bulge 104 on the face thereof opposite the face comprising the blades 102. This bulge 104 is configured to cooperate with the upper flat element 30 of the charging column 3, enabling precise centering and mechanical holding of the trapping device 100 on the charging column 3.

Figure 3C:
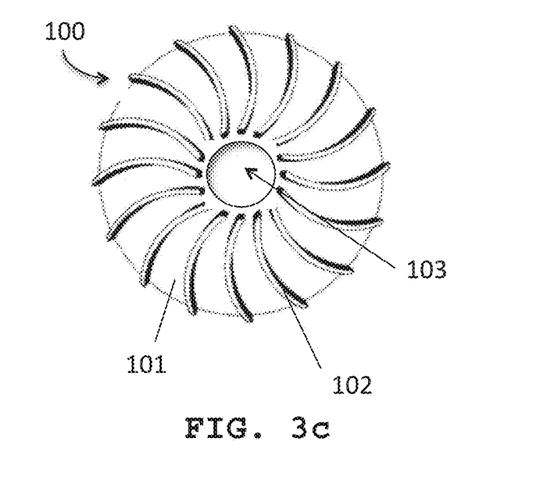
Figure 3D:
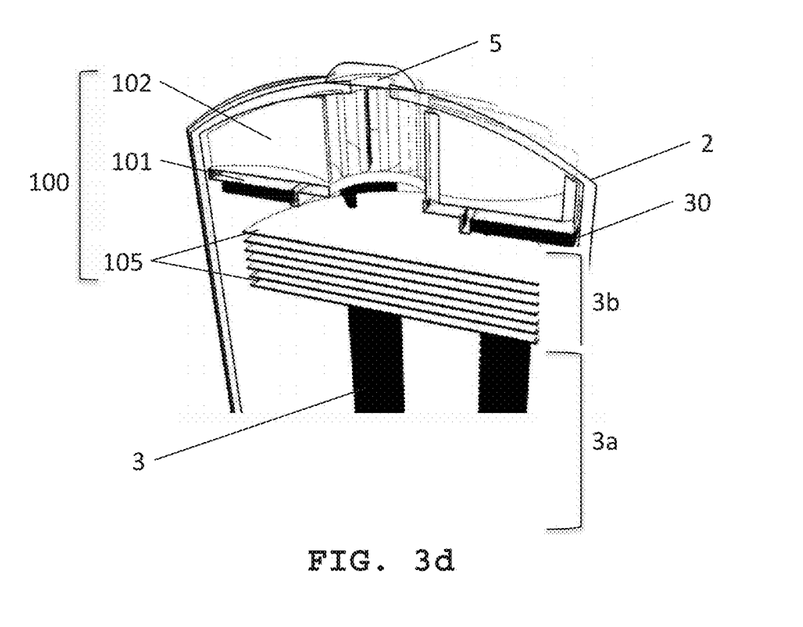

The circular part 101 may comprise a central opening, in the central region 103. The central opening has a diameter between 20% and 50% of the diameter of the circular part 101 (FIG. 3c). In this case, the trapping device 100 advantageously comprises a plurality of screens 105, held in the upper portion 3b of the charging column 3, above the locations of the central portion 3a which are intended to support the substrates 10 (FIG. 3d). The circular part 101, the blades 102 and the screens 105 are all formed of material capable of trapping the contaminants present in the fresh gas: this configuration of the trapping device 100 makes it possible to further increase the contact area thereof with the fresh gas.

Figure 4B:
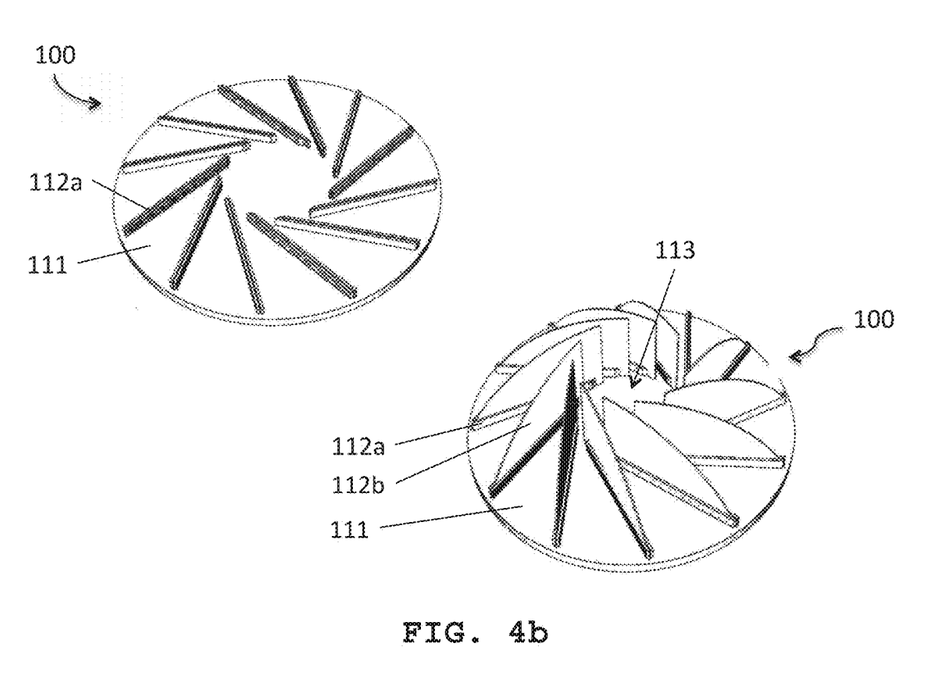

According to a second embodiment of the disclosure, the trapping device 100 also comprises the circular part 111 positioned on the upper flat element 30 of the charging column 3 (FIG. 4a). As illustrated in FIG. 4b, the circular part 111 comprises rectilinear housings 112a, distributed over the upper surface of the circular part 111. The rectilinear housings 112a are configured to receive blades 112b, which are removable and may be individually replaced, independently of the circular part 111. As mentioned above, the blades 112b have the objective of increasing the contact area of the trapping device 100 with the fresh gas, and thus of promoting the trapping of the contaminant gases contained in the fresh gas. The shape of the blades 112b and also the arrangement thereof could also be selected to promote a uniform flow of the fresh gas toward the walls of the chamber 2.

In the example illustrated in FIGS. 4a and 4b, a central region 113 of the circular part 111 is devoid of blades 112b: this is the zone into which the inlet channel 5 injects the fresh gas. The shape and the orientation of the blades 112b promotes uniform flow of fresh gas toward the periphery of the circular part 111, and therefore toward the walls of the chamber 2.

Advantageously, the circular part 111 also comprises a bulge on the face thereof opposite the face comprising the blades 112b. This bulge is configured to cooperate with the upper flat element 30 of the charging column 3, enabling precise centering and mechanical holding of the trapping device 100 on the charging column 3.

Figure 4C:
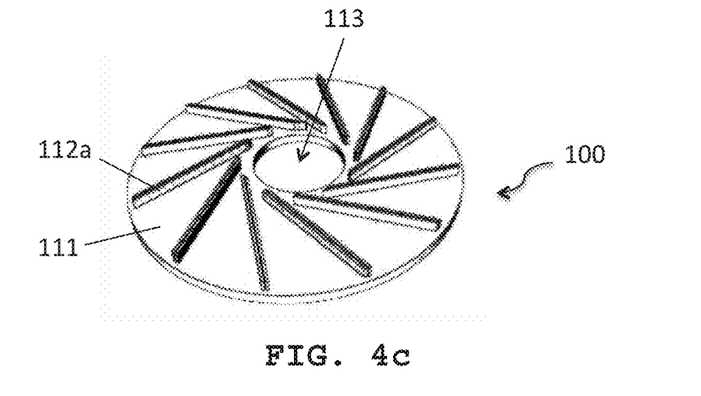
Figure 4D:
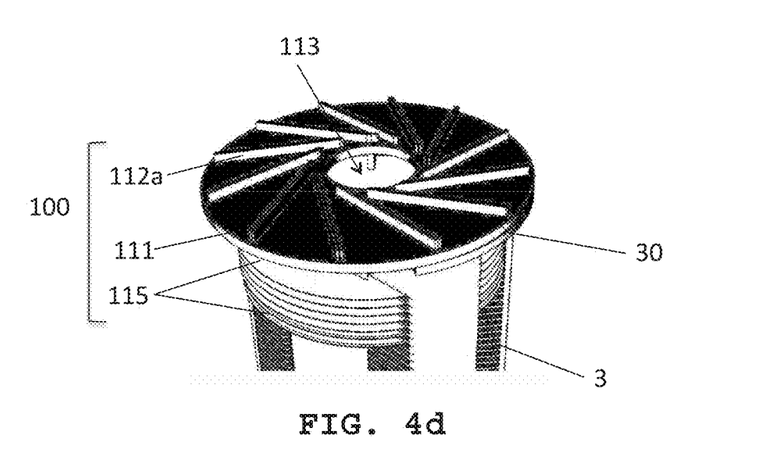

The circular part 111 may comprise a central opening in the central region 113. The diameter of the central opening may be 20% to 50% of the diameter of the circular part 111 (FIG. 4c). In this case, the trapping device 100 advantageously comprises a plurality of screens 115, held in the upper portion 3b of the charging column 3, above the locations of the central portion 3a which are intended to support the substrates 10, as illustrated in FIG. 4d. In FIG. 4d, the blades 112b are not represented to illustrate the central opening in the circular part 111. The circular part 111, the blades 112b and the screens 115 are all formed of material capable of trapping the contaminants present in the fresh gas. This configuration of the trapping device 100 makes it possible to further increase the contact area between the trapping device 100 and the fresh gas.

According to a third embodiment of the disclosure, the trapping device 100 may comprise one or other of the circular parts 101, 111, positioned on the upper flat element 30, the circular part 101, 111 equipped with blades (102, 112b) could have all or some of the other features described in the first or second embodiment. The trapping device 100 also comprises a plurality of screens 125, held in the upper portion 3b of the charging column 3, above the locations of the central portion 3a which are intended to support the substrates 10.

According to this third embodiment, the circular part 101, 111 comprises a central opening and at least the screen 125 placed in the upper position 125a, comprises a central orifice.

In a preferred variant, illustrated in FIG. 5a, all or some of the screens 125, positioned between the screen placed in the upper position 125a and a screen placed in the lower position 125b, each comprise a central orifice, the diameter of which is smaller than that of the orifice of the neighboring screen placed above. This configuration makes it possible to distribute the flow of fresh gas progressively between the various screens 125 and improves the contact area between the trapping device 100 and the gas.

Figure 5B:
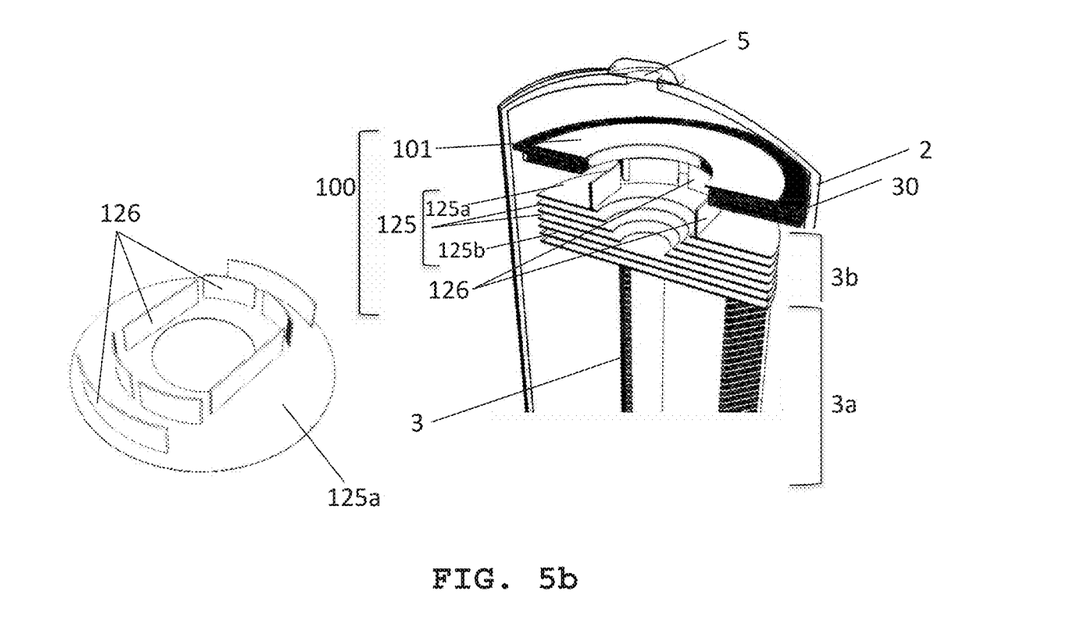

According to another variant of this third embodiment, the screen placed in the upper position 125a comprises vertical elements 126 placed around the central orifice (FIG. 5b). The role of these vertical elements is to channel the flow of gas arriving from the inlet channel 5 through the central opening of the circular part 101, 111 or through the orifice of the upper flat element 30 of the charging column 3, and to promote the progressive distribution thereof between the screens 125.

Of course, the disclosure is not limited to the embodiments described and embodiment variants may be introduced thereinto without departing from the scope of the invention such as defined by the claims.

The invention claimed is:

1. A vertical furnace for treating semiconductor substrates, comprising:
    a chamber;
    at least one heating element;
    a fresh gas inlet channel located at an upper end of the chamber;
    a charging column configured to be received in the chamber, the charging column comprising an upper portion, and a central portion, at least one surface of the central portion defining features sized and configured to support semiconductor substrates of a plurality of semiconductor substrates; and
    a trapping device comprising at least one material, the at least one material capable of trapping at least some contaminants present in fresh gas introduced into the chamber through the fresh gas inlet, the trapping device including:
        a circular part positioned on the upper portion of the charging column, the circular part comprising blades regularly distributed over an upper surface of the circular part, and comprising a central opening having a diameter from 20% to 50% of a diameter of the circular part; and
        a plurality of screens held in the upper portion of the charging column above locations of the central portion intended to support the substrates.

2. The vertical furnace of claim 1, wherein the blades are removable.

3. The vertical furnace of claim 2, wherein at least the screen placed in an upper-most location in the upper portion comprises a central orifice.

4. The vertical furnace of claim 3, wherein all or some of the screens positioned between the screen placed in the upper-most location in the upper portion and a screen placed in a lower-most location in the upper portion, each comprise a central orifice, the diameter of which is smaller than that of an orifice of a neighboring screen located directly thereabove.

5. The vertical furnace of claim 4, wherein the screen placed in the upper-most location in the upper portion comprises at least one vertical element placed around the central orifice.

6. The vertical furnace of claim 5, wherein the trapping device is removable from the charging column when the charging column is outside of the chamber.

7. The vertical furnace of claim 6, wherein the trapping device comprises silicon.

8. The vertical furnace of claim 3, wherein the screen placed in the upper-most location in the upper portion comprises at least one vertical element placed around the central orifice.

9. The vertical furnace of claim 1, wherein at least the screen placed in an upper-most location in the upper portion comprises a central orifice.

10. The vertical furnace of claim 1, wherein the trapping device is removable when the charging column is in a position for discharging the substrate outside of the chamber.

11. The vertical furnace of claim 1, wherein the trapping device comprises silicon.

* * * * *